United States Patent
Patti et al.

(10) Patent No.: US 11,574,996 B2
(45) Date of Patent: Feb. 7, 2023

(54) HIGH-VOLTAGE CAPACITOR, SYSTEM INCLUDING THE CAPACITOR AND METHOD FOR MANUFACTURING THE CAPACITOR

(71) Applicant: STMICROELECTRONICS S.R.L., Agrate Brianza (IT)

(72) Inventors: Davide Giuseppe Patti, Mascalucia (IT); Giuseppina Valvo, Catania (IT); DelfoNunziato Sanfilippo, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 49 days.

(21) Appl. No.: 17/170,550

(22) Filed: Feb. 8, 2021

(65) Prior Publication Data

US 2021/0159309 A1      May 27, 2021

Related U.S. Application Data

(62) Division of application No. 16/144,168, filed on Sep. 27, 2018, now Pat. No. 10,916,622.

(30) Foreign Application Priority Data

Sep. 28, 2017 (IT) .......................... 102017000108913
Sep. 28, 2017 (IT) .......................... 102017000108918

(51) Int. Cl.
*H01L 49/02* (2006.01)
*H01L 23/522* (2006.01)

(52) U.S. Cl.
CPC .......... *H01L 28/60* (2013.01); *H01L 23/5223* (2013.01); *H01L 23/5225* (2013.01)

(58) Field of Classification Search
CPC .. H01L 28/60; H01L 23/5223; H01L 23/5225
See application file for complete search history.

(56) References Cited

U.S. PATENT DOCUMENTS

| | | | |
|---|---|---|---|
| 5,172,201 A | 12/1992 | Suizu | |
| 5,185,284 A * | 2/1993 | Motonami | ........ H01L 27/10835 438/246 |
| 5,311,057 A * | 5/1994 | McShane | .......... H01L 23/49589 257/784 |
| 6,737,698 B1 | 5/2004 | Paul et al. | |

(Continued)

*Primary Examiner* — Bilkis Jahan
*Assistant Examiner* — Victor V Barzykin
(74) *Attorney, Agent, or Firm* — Seed Intellectual Property Law Group LLP

(57) ABSTRACT

In various embodiments, the present disclosure provides capacitors and methods of forming capacitors. In one embodiment, a capacitor includes a substrate, a first electrode on the substrate, a second electrode, and a first dielectric layer. A portion of the first electrode is exposed in a contact region. The first dielectric layer includes a first dielectric region between the first electrode and the second electrode, and a second dielectric region between the first dielectric region and the contact region. The second dielectric region is contiguous to the first dielectric region, and a surface of the second dielectric region defines a surface path between the first electrode and the contact region. The second dielectric region has a plurality of grooves that increase a spatial extension of said surface path.

18 Claims, 9 Drawing Sheets

(56) References Cited

U.S. PATENT DOCUMENTS

| | | | |
|---|---|---|---|
| 2006/0197133 A1* | 9/2006 | Jung | H01L 23/5225 257/E21.011 |
| 2007/0109719 A1* | 5/2007 | Kuwajima | H01G 4/40 361/311 |
| 2009/0079029 A1* | 3/2009 | Chen | H01L 23/5223 257/532 |
| 2011/0163452 A1* | 7/2011 | Horii | H01L 21/28194 257/E23.141 |
| 2014/0367831 A1 | 12/2014 | Yen et al. | |
| 2016/0133690 A1 | 5/2016 | West et al. | |
| 2016/0190227 A1 | 6/2016 | Jin et al. | |
| 2019/0019776 A1* | 1/2019 | Tuncer | H01L 24/73 |

* cited by examiner

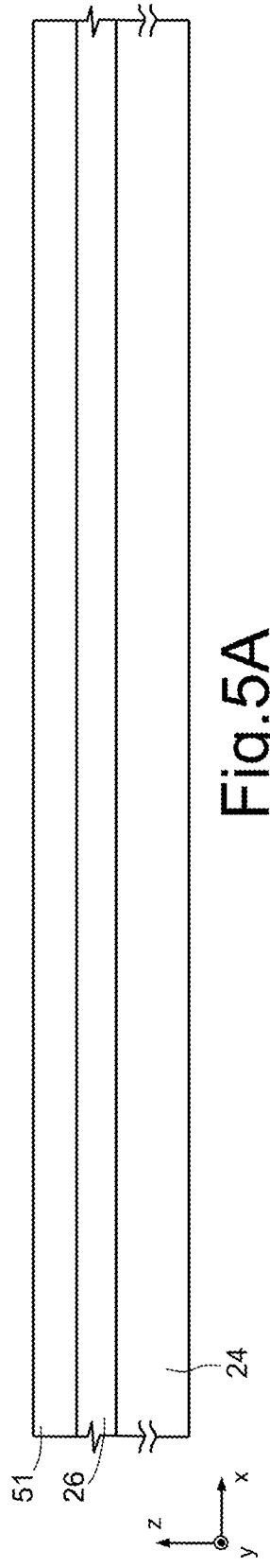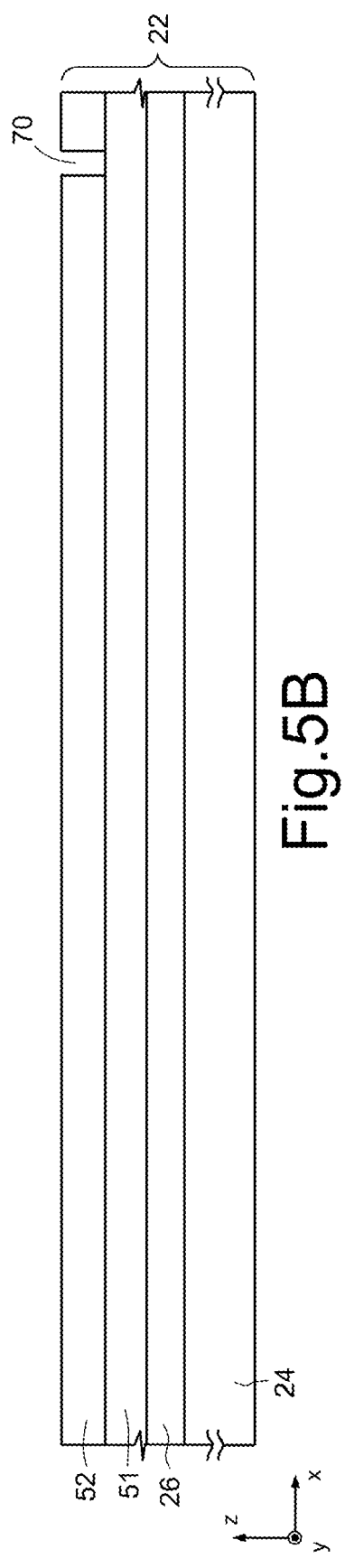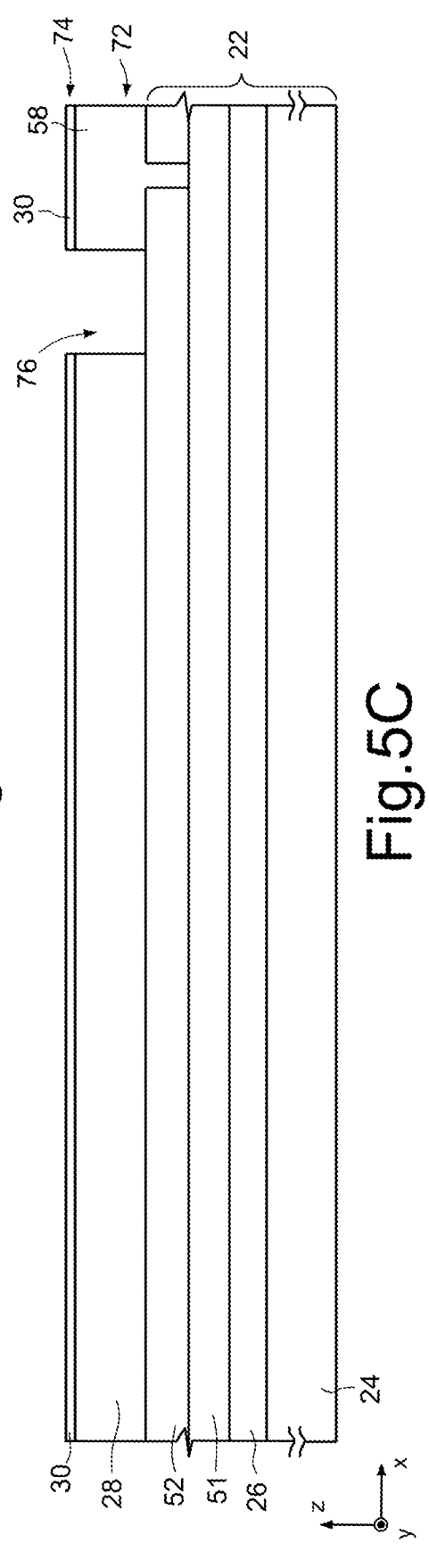

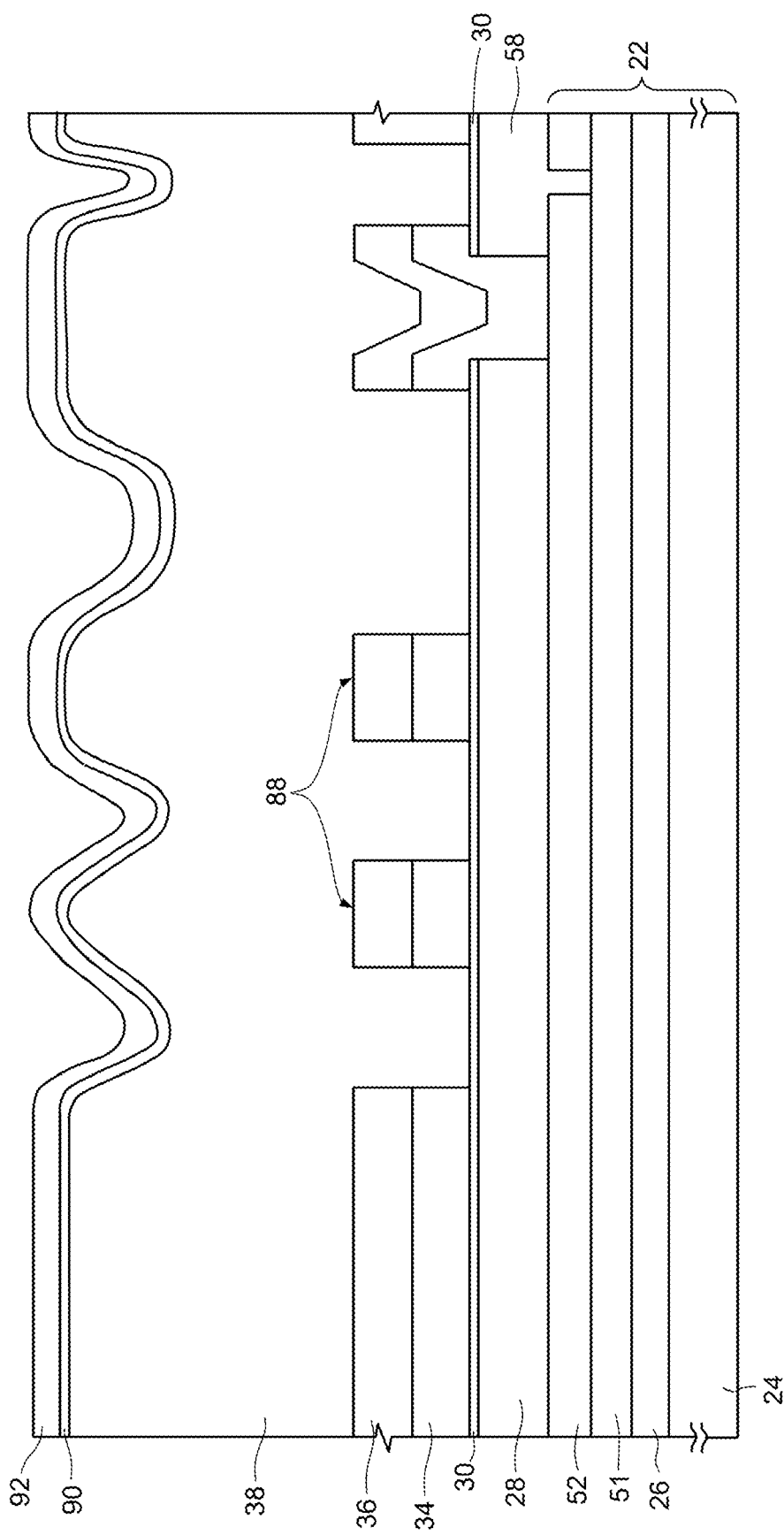

HIGH-VOLTAGE CAPACITOR, SYSTEM INCLUDING THE CAPACITOR AND METHOD FOR MANUFACTURING THE CAPACITOR

BACKGROUND

Technical Field

The present disclosure relates to a high-voltage capacitor, to a system including the capacitor, and to a method for manufacturing the capacitor.

Description of the Related Art

High-voltage (HV) capacitors for integrated circuits are known, configured for enabling the transmission of signals at high frequencies, for example of the order of megahertz, between conductive elements biased at a very high difference of potential, for example around 10 kV or of the order of tens of kilovolts, and that hence typically include electrical insulation; see, for example, the document No. US 2016/0133690.

Said HV capacitors typically have dielectric layers of a thickness large enough to present a breakdown voltage higher than the difference of potential at which, in use, its terminals are biased.

FIG. 1 shows, in a triaxial system of orthogonal co-ordinates x, y, z, a lateral cross-sectional view in the plane xz of a HV capacitor 1 of a known type. The HV capacitor 1 comprises a substrate 2, a bottom electrode 4, which extends over the substrate 2, a dielectric layer 6, which extends over the bottom electrode 4, and a top electrode 8, which extends over the dielectric layer 6. The portion of the dielectric layer 6 set on top, in plan view in the plane xy, of the top electrode 8 and the bottom electrode 4 constitutes the active area 9 of the HV capacitor 1, offering the highest contribution to the capacitance of the HV capacitor 1.

A recess 10 extends throughout the thickness of the dielectric layer 6 so as to expose a contact region 12 of the bottom electrode 4, and hence enable electrical contact of the bottom electrode 4.

The thickness of the dielectric layer 6 is such as to obtain the desired breakdown voltage and is typically in the region of a few tens of micrometers.

The present applicant has found that a further mechanism of breakdown of HV capacitors is due to the accumulation over time of contaminating particles on the top surface of the dielectric layer 6, which may form a surface conductive path between the top electrode 8 and the contact region 12, drastically reducing the lateral surface resistance between the top electrode 8 and the contact region 12 and introducing excessive leakage currents. Moreover, also the presence of humidity on the top surface of the dielectric layer 6 may reduce the surface resistance and favor conductive phenomena. In these conditions, arc short circuits may be set up between edges of the top surface of the dielectric layer 6 (facing the contact region 12) and the contact region 12.

BRIEF SUMMARY

In various embodiments, the present disclosure provides a capacitor, a system including the capacitor, and a method for manufacturing the capacitor, that overcome one or more of the drawbacks of the known art.

In one embodiment, the present disclosure provides a capacitor that includes a substrate, a first electrode on the substrate, a second electrode, and a first dielectric layer. A portion of the first electrode is exposed in a contact region. The first dielectric layer includes a first dielectric region between the first electrode and the second electrode, and a second dielectric region between the first dielectric region and the contact region. The second dielectric region is contiguous to the first dielectric region, and a surface of the second dielectric region defines a surface path between the first electrode and the contact region. The second dielectric region has a plurality of grooves that increase a spatial extension of said surface path.

In another embodiment, the present disclosure provides a system that includes a first electronic circuit configured to generate an output signal having a first voltage and a frequency, and a second electronic circuit coupled to the first electronic circuit and configured to accept at an input a signal having a second voltage lower than the first voltage. A capacitor is coupled between the first electronic circuit and the second electronic circuit, and the capacitor is configured to galvanically isolate the first and second electronic circuits and transfer information associated with the frequency of the output signal. The capacitor includes: a substrate; a first electrode on the substrate, a portion of the first electrode being exposed in a contact region; a second electrode; a first dielectric layer including a first dielectric region between the first electrode and the second electrode, and a second dielectric region between the first dielectric region and the contact region, the second dielectric region being contiguous to the first dielectric region, a surface of the second dielectric region defining a surface path between the second conductive layer and the contact region, wherein said second dielectric region has a plurality of grooves that increase a spatial extension of said surface path.

In yet another embodiment, the present disclosure provides a method that includes: forming, on a substrate, a first electrode including a first conductive layer; forming, on the substrate, a contact region by exposing a portion of the first conductive layer; forming a first dielectric layer on the first electrode, the first dielectric layer including a first dielectric region and a second dielectric region, the second dielectric region being contiguous to the first dielectric region and extends between the first dielectric region and the contact region; forming a second electrode including a second conductive layer on the first dielectric layer in the first dielectric region, a surface of the second dielectric region defining a surface path between the second conductive layer and the contact region; and forming a plurality of grooves in the second dielectric region, the plurality of grooves increase a spatial extension of said surface path.

BRIEF DESCRIPTION OF THE SEVERAL VIEWS OF THE DRAWINGS

For a better understanding of the present disclosure preferred embodiments will now be described, purely by way of non-limiting example, with reference to the attached drawings, wherein:

FIGS. 5A-5F show a method for manufacturing the HV capacitor of FIG. 4; and

DETAILED DESCRIPTION

Figure 2:
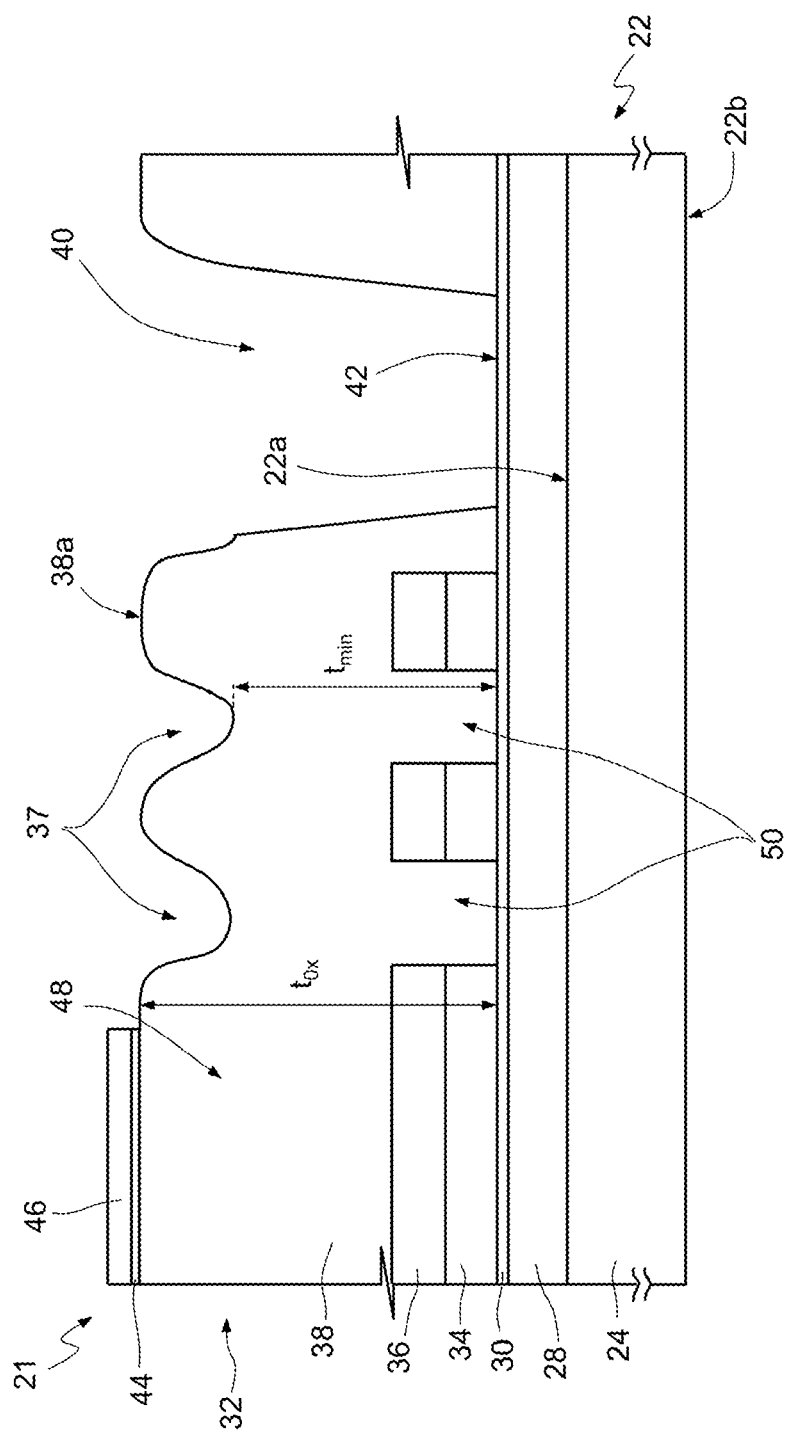
FIG. 2 is a schematic cross-sectional view of a HV capacitor according to an embodiment of the present disclosure.

FIG. 2 shows, in a triaxial system of orthogonal co-ordinates x, y, z, a lateral cross-sectional view in the plane xz of a capacitor 21. In particular, the capacitor 21 is of a type for use in high voltage or extra-high voltage applications (referred to hereinafter also generically as HV). In this context, by "high voltage" or "extra-high voltage" are meant voltages ranging between 5 000 V and 20 000 V.

Figure 3:
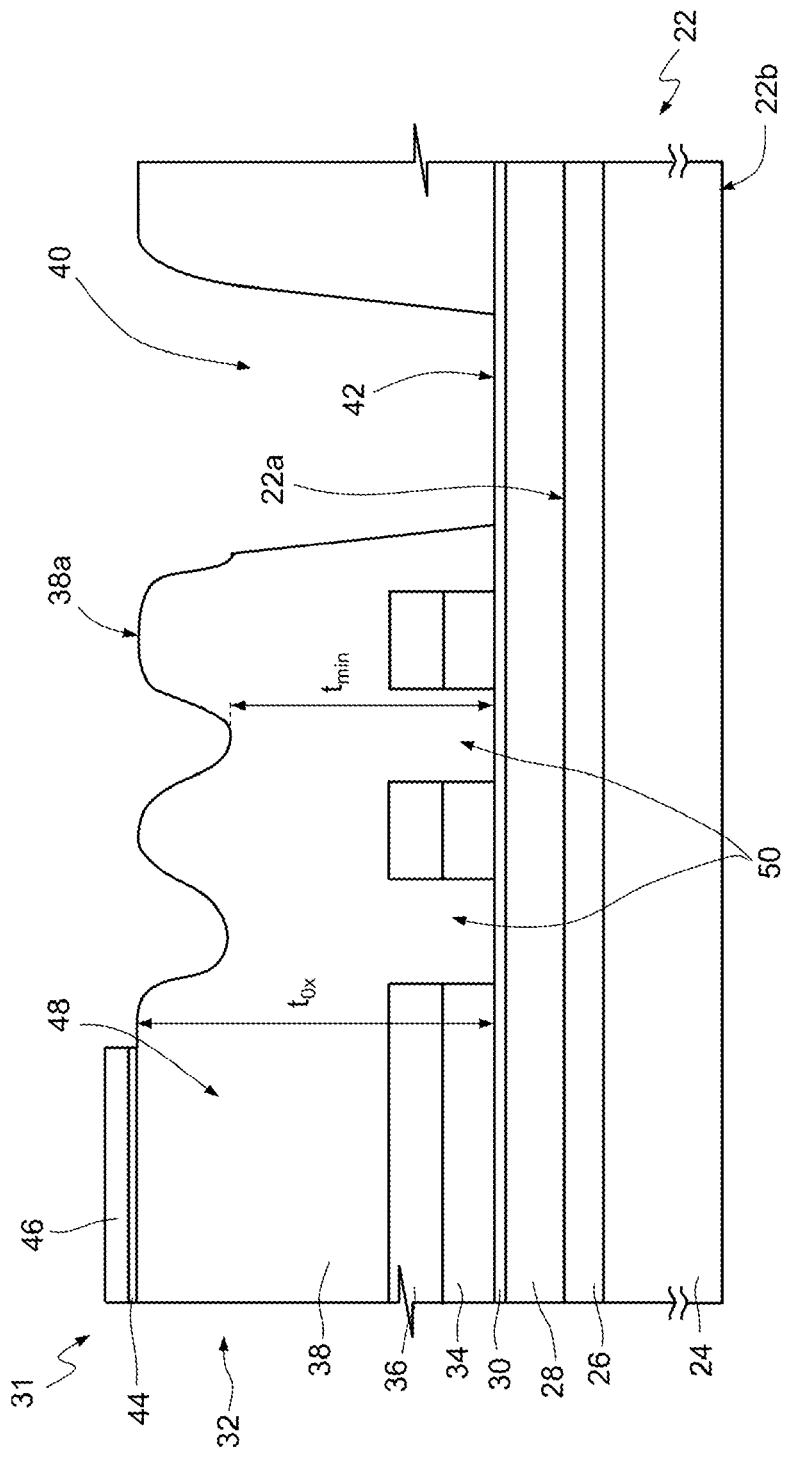
FIG. 3 is a schematic cross-sectional view of a HV capacitor according to another embodiment of the present disclosure.

The HV capacitor 21 comprises a substrate 22, which extends between a front surface 22a of the substrate 22 (parallel to the plane xy) and a rear surface 22b of the substrate 22 (parallel to the plane xy). In the embodiment of FIG. 2, the substrate 22 is made of insulating material, such as silicon dioxide ($SiO_2$), having a thickness, for example, ranging between 0.5 µm and 2 µm, in particular 0.7 µm (which can be deposited on a substrate, for example, made of high-resistivity silicon). FIG. 3 shows a HV capacitor 31 according to a further embodiment. The HV capacitor 31 differs from the HV capacitor 21 exclusively as regards the material of the substrate 22. The substrate 22 of the HV capacitor 31 comprises a high-resistivity substrate 24 and a field plate oxide layer 26, which extends over the high-resistivity substrate 24. The high-resistivity substrate is, for example, made of polysilicon or silicon with high electrical resistivity, for example higher than 1000 Ω·cm, and has a thickness ranging between 100 µm and 500 µm, in particular 280 µm. The field plate oxide layer 26 is, for example, made of silicon dioxide and has a thickness ranging between 0.5 µm and 2 µm, in particular 0.7 µm.

The HV capacitor 21 of FIG. 2 further comprises a bottom electrode 28, which extends over the substrate 22. The bottom electrode 28 is made of conductive material, such as aluminum or copper and has a thickness, for example, ranging between 0.5 µm and 3 µm, in particular 1.5 µm. Preferably, a protective layer 30 extends over the bottom electrode 28, in order to protect the bottom electrode 28 preventing oxidation of the bottom electrode 28. For instance, the protective layer 30 is made of titanium or titanium nitride (TiN) and has a thickness, for example, ranging between 20 nm and 50 nm, in particular 30 nm. In other embodiments, the protective layer 30 could be omitted.

The HV capacitor 21 further comprises a dielectric multilayer 32, which extends over the protective layer 30. In embodiments in which the protective layer 30 is not present, the dielectric multilayer 32 extends over the bottom electrode 28.

The dielectric multilayer 32 comprises a first dielectric layer 34, for example made of tetraethyl orthosilicate (TEOS) or of silicon dioxide that can be obtained by any process of deposition on metal material. The first dielectric layer has a thickness, for example, ranging between 1 µm and 2 µm, in particular 1 µm.

Preferably, the dielectric multilayer 32 comprises a second dielectric layer 36, which extends over the first dielectric layer 34. The second dielectric layer 36 is made of a material different from that of the first dielectric layer 34, for example silicon nitride ($Si_3N_x$) or silicon oxynitride ($Si$-$O_xN_y$) and has a thickness, for example, ranging between 1 µm and 2 µm, in particular 1 µm. Use of a number of depositions and a number of dielectric materials to form the dielectric multilayer 32 minimizes the possibility of having structural defects that extend throughout the thickness of the dielectric multilayer 32. The second dielectric layer 36 may be omitted.

The dielectric multilayer 32 further comprises a third dielectric layer 38, which extends over the second dielectric layer 36. In embodiments in which the second dielectric layer 36 is not present, the third dielectric layer 38 extends over the first dielectric layer 34. According to an aspect of the present disclosure, the third dielectric layer 38 is made of polymeric material that can be laid in a conformable way, such as polyimide (PI), and has a thickness ranging between 10 µm and 30 µm, in particular 20 µm.

The dielectric multilayer 32 comprises a recess 40, which extends throughout its thickness, exposing a contact region 42 of the protective layer 30 and hence enabling electrical contact of the bottom electrode 28 of the HV capacitor 21, for example via wire bonding techniques. In embodiments in which the protective layer 30 is omitted, the contact region 42 extends directly over the bottom electrode 28.

The HV capacitor 21 further comprises a top electrode 46, which extends over the dielectric multilayer 32. The top electrode 46 is made of conductive material, such as gold, and has a thickness ranging between 0.1 µm and 0.2 µm, in particular 0.1 µm. Use of gold is preferable to facilitate wire bonding techniques. Preferably, the HV capacitor 21 further comprises a barrier layer 44, which extends between the top electrode 46 and the dielectric multilayer 32, in order to hinder the migration of atoms of the top electrode 46 towards the dielectric multilayer 32 that could favor undesired conductive paths between the top electrode 46 and the bottom electrode 28. The barrier layer 44 is made of metal material, such as titanium, and has a thickness, for example, ranging between 30 nm and 100 nm, in particular 50 nm.

The area of extension of the top electrode 46, in plan view in the plane xy, delimits an overlap region between the top electrode 46, the dielectric multilayer 32, and the bottom electrode 28, referred to in what follows as "active area 48". In other words, the HV capacitor 21 is a parallel-plate capacitor having an area limited by the area of extension of the top electrode 46. The area of extension of the top electrode 46, in plan view in the plane xy, ranges between 80×80 µm² and 200×200 µm², in particular 100×100 µm², and has a shape chosen from rectangular, circular, elliptical, polygonal, or polygonal with rounded corners.

Figure 1:
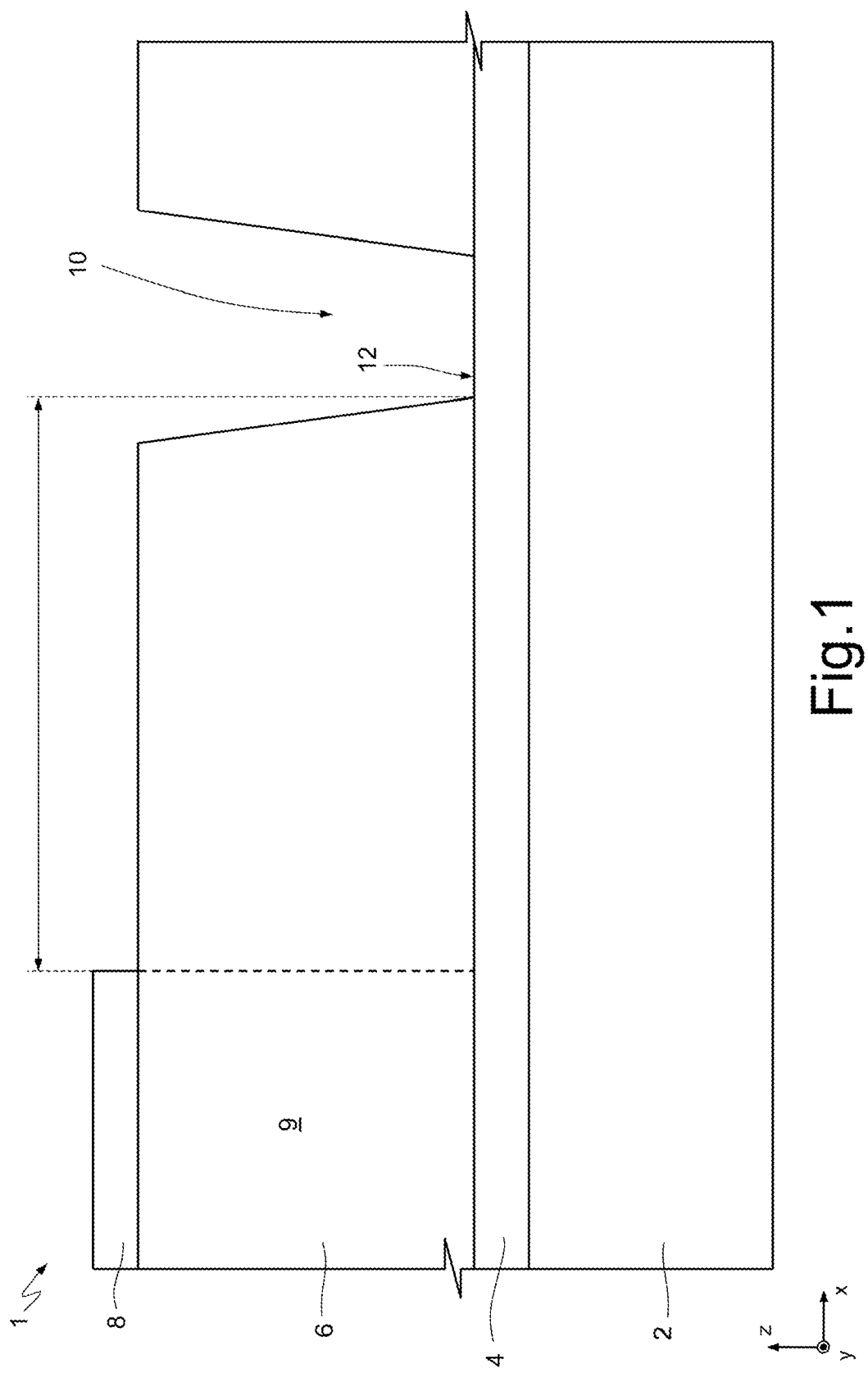
FIG. 1 is a schematic cross-sectional view of a high-voltage (HV) capacitor according to an embodiment of a known type.

The first dielectric layer 34 has a plurality of openings 50 in a region set between the active area 48 and the contact region 42. In the embodiments in which the second dielectric layer 36 is present, also this has a plurality of openings 50 aligned along the axis z to the plurality of openings 50 of the first dielectric layer 34. Consequently, the portion of the dielectric multilayer 32 included in the active area 48 has a constant thickness $t_{ox}$, given by the sum of the thicknesses of the dielectric layers that make it up, whereas the portion of the dielectric multilayer 32 external to the active area 48 has a thickness ranging between a maximum value, corresponding to $t_{ox}$, and a minimum value $t_{min}$, corresponding to the thickness of just the third dielectric layer 38. In other words, the third dielectric layer 38 has depressions or grooves 37 at the openings 50. In particular, the third dielectric layer 38 has a top surface 38a that, in lateral cross-sectional view in the plane xz, has an undulated profile. Consequently, the length of the surface resistive path between the top electrode 46 and the contact region 42 increases as compared to the embodiment of a known type illustrated in FIG. 1, wherein the dielectric layer does not have any grooves 37. Consequently, given the same surface resistance between the top electrode 46 and the contact region 42, the HV capacitors 21, 31 of the respective embodiments of FIGS. 2 and 3 are more compact than the HV capacitor 1 of a known type of FIG. 1. In one or more embodiments, the length of the shortest resistive electrical path, among a plurality of surface resistive electrical paths between the top electrode 46 and the contact region 42, is within a range from 60 µm to 1060 µm.

According to one embodiment, the openings 50 have a main direction of extension orthogonal to the direction of propagation of the current between the top electrode 46 and the contact region 42. Similarly, the grooves 37 may have a main direction of extension orthogonal to the direction of propagation of the current between the top electrode 46 and the contact region 42. The main direction of extension of the openings 50 may be aligned with, or the same as, the main direction of extension of the grooves 37.

According to another embodiment, the main direction of extension of the openings 50 and/or the grooves 37 is not orthogonal to the direction of propagation of the current, and forms an angle ranging between 20° and 90° with the direction of propagation of the current between the top electrode 46 and the contact region 42.

In general, it is in any case expedient for the main direction of extension of the openings 50 not to be parallel to the direction of propagation of the current between the top electrode 46 and the contact region 42.

Figure 4:
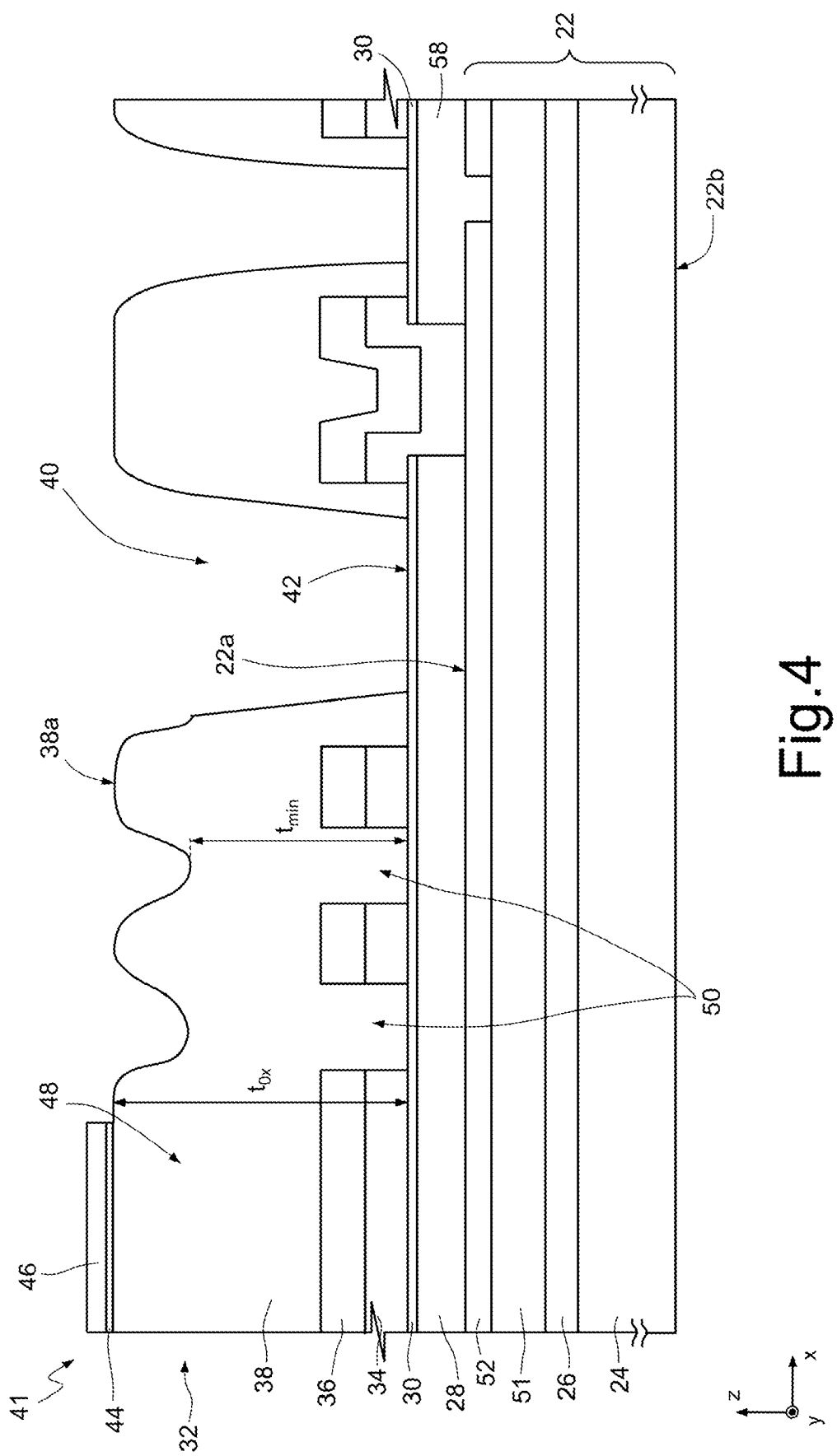
FIG. 4 is a schematic cross-sectional view of a HV capacitor according to a further embodiment of the present disclosure.
Figure 5D:
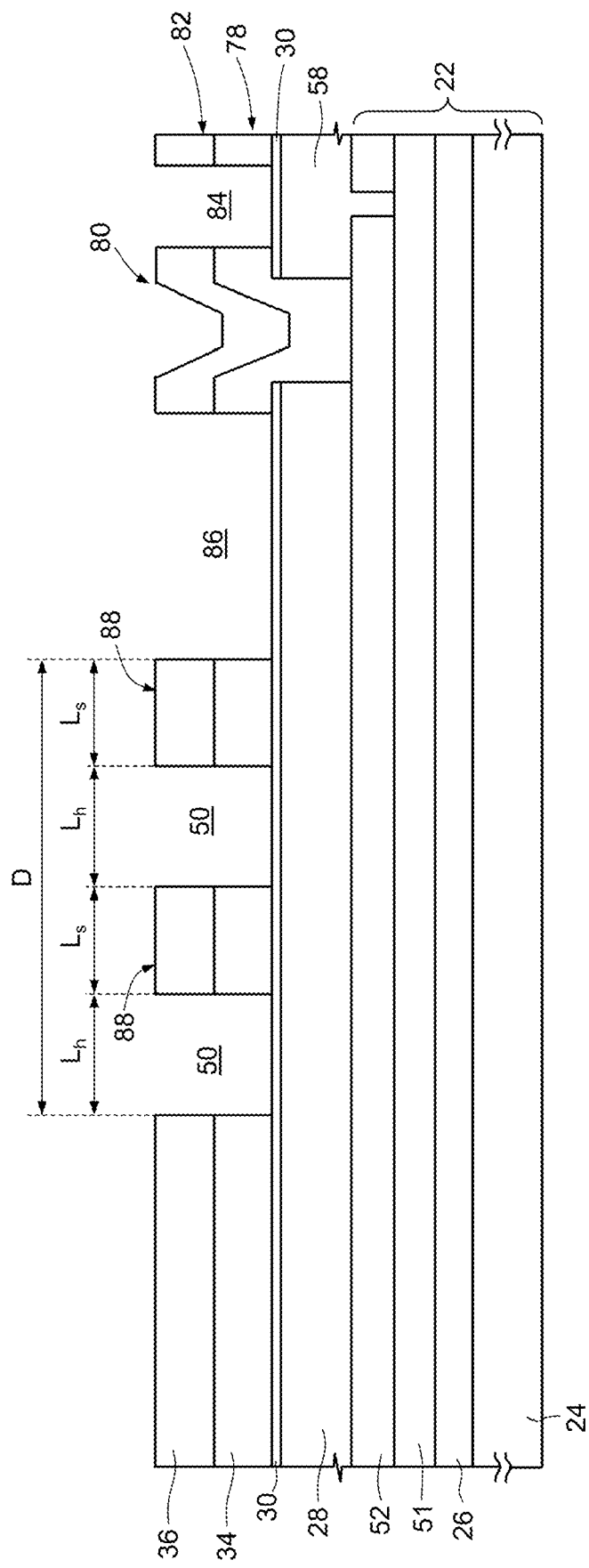
Figure 5F:
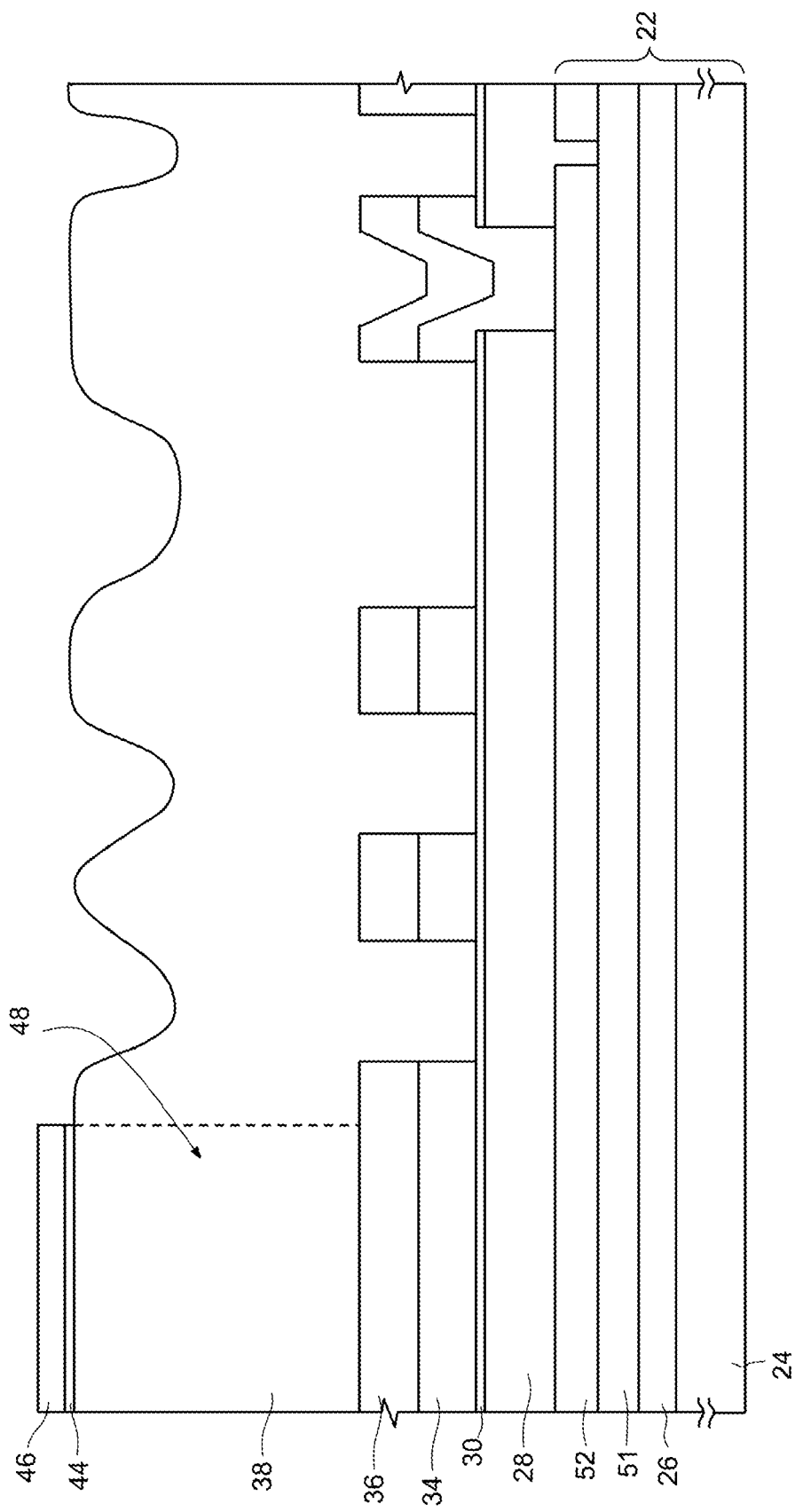

FIG. 4 is a lateral cross-sectional view in the plane xz of a HV capacitor 41 according to a further embodiment of the present disclosure. The HV capacitor 41 differs from the HV capacitor 31 of FIG. 3 due to the presence of further layers forming the substrate 22. Elements of the HV capacitor 41 that are common to the HV capacitor 31 are designated by the same reference numbers and are not described any further herein.

In particular, the substrate 22 of the HV capacitor 41 further comprises an electromagnetic shield layer 51, which extends over the field plate oxide layer 26 in order to protect the HV capacitor 41 from electromagnetic disturbances coming from outside. The electromagnetic shield layer 51 is made of conductive material, such as doped polysilicon or metal, and has a thickness, for example, ranging between 0.3 µm and 1.5 µm, in particular 0.5 µm.

The substrate 22 of the HV capacitor 41 further comprises an insulating layer 52, which extends over the electromagnetic shield layer 51. The insulating layer 52 is, for example, made of tetraethyl orthosilicate (TEOS) or of silicon dioxide that can be obtained by any process of deposition on metal material and has a thickness, for example, ranging between 0.5 µm and 0.7 µm, in particular 0.5 µm.

The insulating layer 52 functions as electrical insulating layer between the electromagnetic shield layer 51 and the bottom electrode 28. The electromagnetic shield layer 51 is electrically connected to an electrical terminal 58 through an opening of the insulating layer 52, enabling, in use, biasing of the electromagnetic shield layer 51 at a reference voltage. According to an aspect of the present disclosure, the electrical terminal 58 is formed starting from the same deposition of metal material as that of the bottom electrode 28 and creating an opening designed to insulate the bottom electrode 28 electrically from the electrical terminal 58. Preferably, the protective layer 30 also extends over the electrical terminal 58, in order to protect the electrical terminal 58 from oxidation phenomena.

In another embodiment (not illustrated), the high-resistivity substrate 24 and the field plate oxide layer 26 are replaced by a substrate made of insulating material, such as silicon dioxide ($SiO_2$), having a thickness, for example, ranging between 200 µm and 600 µm, in particular 300 µm. In this case, the electromagnetic shield layer 51 extends directly over the substrate made of insulating material.

Described with reference to FIGS. 5A-5F are steps of a method for manufacturing the HV transistor 41 of FIG. 4.

With reference to FIG. 5A, a wafer is provided, which includes the high-resistivity substrate 24. This is followed by the step of forming the field plate oxide layer 26 on the high-resistivity substrate 24, for example via thermal growth of silicon dioxide. There then follows the step of forming the electromagnetic shield layer 51 on the field plate oxide layer 26, for example via deposition of doped polysilicon or a metal layer.

Then (FIG. 5B), the step of forming the insulating layer 52 is carried out, for example via deposition of a TEOS layer and masked etching of the TEOS layer to form an opening 70, which extends throughout the thickness of the TEOS layer, in a region corresponding to the electromagnetic shield layer 51, where, in subsequent steps of the manufacturing method, an electrical contact with the electrical terminal 58 will be formed. The substrate 22 is thus formed.

Then (FIG. 5C), the step of forming a first conductive layer 72 is carried out, for example via deposition of metal material, such as aluminum or copper on the insulating layer 52, simultaneously filling the opening 70 and hence forming an electrical contact between the electromagnetic layer 51 and the first conductive layer 72. Then, a second conductive layer 74 is formed on the first conductive layer 72, for example via deposition of metal material, such as titanium or titanium nitride (TiN).

This is followed by the step of forming an opening 76, which is laterally staggered with respect to the opening 70 and extends throughout the thickness of the first and second conductive layers 72, 74 in order to insulate electrically from one another two regions of the first conductive layer 72, which form the bottom electrode 28 and the electrical terminal 58, respectively. For instance, in plan view in the plane xy, the opening 76 entirely surrounds the electrical terminal 58. The second conductive layer 74 thus forms the protective layer 30. The opening 76 is formed, for example, via dry chemical etching.

Then (FIG. 5D), the step of forming the first dielectric layer 34 is carried out, for example via deposition of TEOS or $SiO_2$ obtained via CVD or PECVD. The first dielectric layer 34 fills the opening 76 entirely and extends over the protective layer 30. This is followed by the step of forming the second dielectric layer 36 on the first dielectric layer 34, made of a material different from that of the first dielectric layer 34, for example silicon nitride ($Si_3N_x$) or silicon oxynitride ($SiO_xN_y$).

There then follows the step of masked etching of the first and second dielectric layers 34, 36 in order to form a plurality of openings, which extend throughout the thickness of the first and second dielectric layers 34, 36, exposing respective regions of the protective layer 30.

The step of masked etching of the first and second dielectric layers 34, 36 comprises forming an opening 84 in a position corresponding to the electrical terminal 58, partially exposing the region of the protective layer 30 on the electrical terminal 58. Simultaneously, an opening 86 is formed in a region of the bottom electrode 28 where the contact region 42 will be formed, laterally staggered with respect to the opening 76 formed, in the step of FIG. 5C, in the first conductive layer. Part of an electrical insulating structure 80 is thus formed between the bottom electrode 28 and the electrical terminal 58. Simultaneously, a plurality of openings 50 is formed, laterally staggered with respect to the opening 86. In other words, the opening 86 extends between the plurality of openings 50 and the electrical insulating structure 80. The openings 50 have an extension $L_h$, measured along the axis x, comprised, for example, between 20 µm and 30 µm, in particular 20 µm. In a non-limiting embodiment, the openings 50 are set at equal distances apart from one another. The number of openings 50 is, for example, between 2 and 20, for example 10. Consequently, each opening of the plurality of openings 50 is separated from an adjacent opening by a spacer 88 formed by the first and second dielectric layers 78, 82 and having an extension $L_s$, measured along the axis x, comprised, for example, between 5 µm and 20 µm, in particular 10 µm. Consequently, the extension D obtained from the sum of the extension $L_s$ of each spacer 88 and the extension $L_h$ of each opening 50 is between 55 µm and 1020 µm.

Next (FIG. 5E), the step of forming the third dielectric layer 38 is carried out, for example, via spin coating of polyimide or another polymer capable of following in a conformable way the topography due to the spacers 88, also for thicknesses of the third dielectric layer 38 of some tens of micrometers. The third dielectric layer 38 fills the openings 50, 84, 86 of the first and second dielectric layers 34, 36 completely.

Then, the step of forming a third conductive layer 90 on the third dielectric layer 38 is carried out, for example, via sputtering of metal material, such as titanium.

This is then followed by the step of forming a fourth conductive layer 92 on the third conductive layer 90, for example via sputtering of metal material, such as gold.

Next (FIG. 5F), the step of masked etching of the third and fourth conductive layers 90, 92 is carried out, for example by wet or dry chemical etching, so as to remove the third and fourth conductive layers 90, 92 entirely, except for regions that, in plan view in the plane xy, delimit the active area 48 of the HV capacitor 41. The barrier layer 44 and the top electrode 46 are thus formed.

There then follows the step of masked etching of the third dielectric layer 38, to form the recess 40 (and expose the contact region 42) and another recess in a position corresponding to the electrical terminal 58, partially exposing the region of the protective layer 30 on the electrical terminal 58. The HV capacitor 41 of FIG. 4 is thus obtained.

Figure 6:
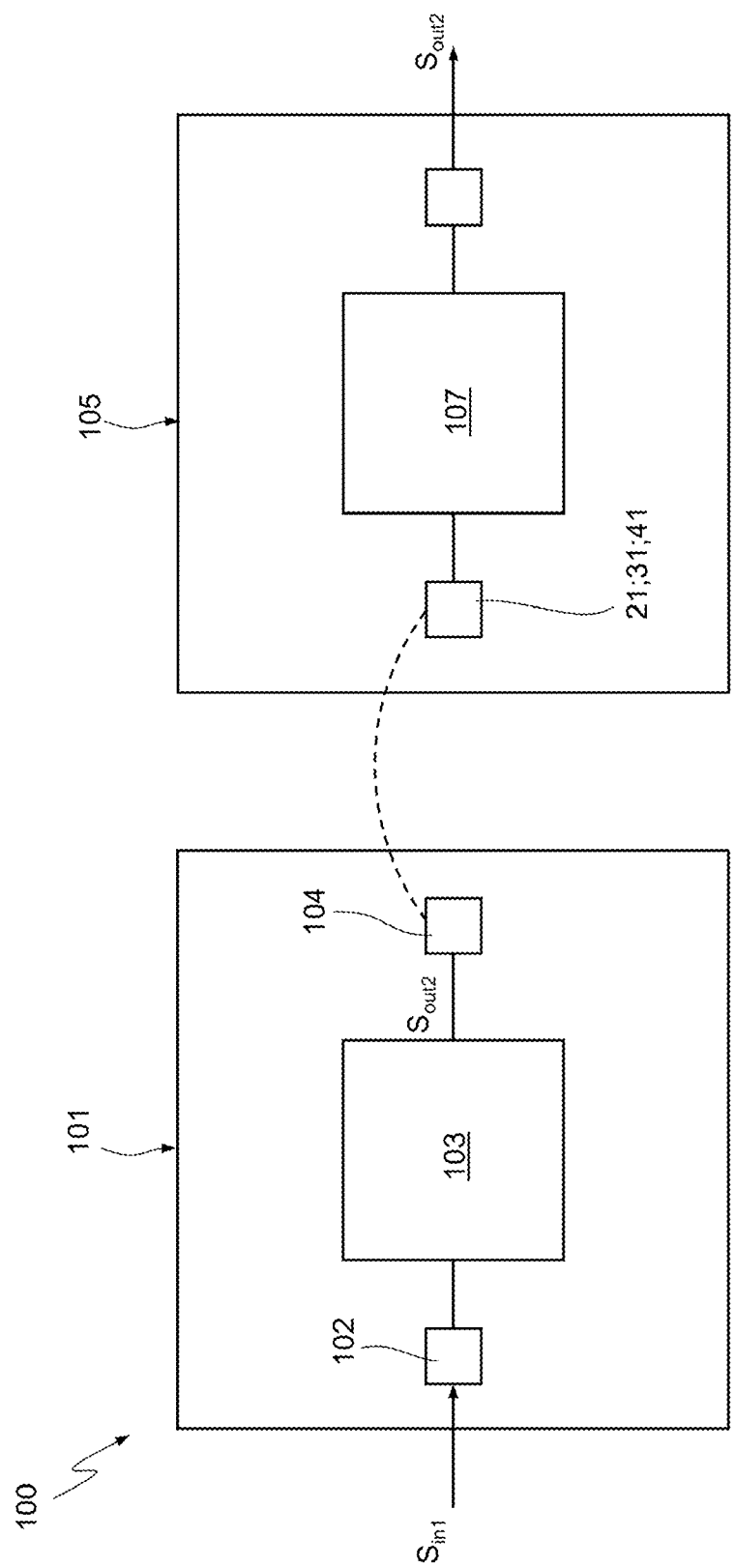
FIG. 6 shows a block diagram of an electronic system including a HV capacitor according to any one of the embodiments of the present disclosure.

FIG. 6 shows a block diagram of an electronic system 100 comprising a HV capacitor 21 or 31 or 41, according to the respective embodiment described previously. The electronic system 100 comprises a first electronic circuit 101 and a second electronic circuit 105, coupled to one another via the HV capacitor 21, 31, 41. In a non-limiting example, the first and second electronic circuits 101, 105 may be integrated on respective dies coupled to one another and housed in one and the same package.

An input terminal 102 of the first electronic circuit 101 is configured for receiving an input signal $S_{in1}$. The input terminal 102 is electrically coupled to a processing circuit 103 of the first electronic circuit 101. The processing circuit 103 is configured for processing the input signal $S_{int}$ and generating a first output signal $S_{out1}$ at high frequency, on an output terminal 104 of the first electronic circuit 101. The second electronic circuit 105 houses the HV capacitor 21, 31, 41. The output terminal 104 of the first electronic circuit 101 is electrically coupled to the contact region 42 of the HV capacitor 21, 31, 41, for example by means of wire bonding techniques. The HV capacitor 21, 31, 41 is likewise electrically coupled to a processing circuit 107 of the second electrical circuit 105, configured for acquiring an output signal from the HV capacitor 21, 31, 41, processing said signal, and generating a second output signal $S_{out2}$. Electrical coupling between the first and second electronic circuits 101, 105 by means of the HV capacitor 21, 31, 41 enables transfer between the processing circuit 103 and the processing circuit 107 of the information associated with the first output signal $S_{out1}$ also in the case where there is a high difference of potential (for example, in the region of 10 kV) between the d.c. component of the first output signal Smut and the voltage accepted at input by the processing circuit 107 of the second electrical circuit 105.

From an examination of the characteristics of the disclosure described and illustrated herein, the advantages that it affords are evident.

For instance, obtaining a curvilinear surface profile of the third dielectric layer 38, by formation of spacers 88, enables an increase in the length, and hence resistance, of the lateral surface path between the top electrode 46 and the contact region 42 of the bottom electrode 28. Consequently, given the same surface resistance between the top electrode 46 and the contact region 42, the HV capacitors 21, 31, 41 of FIGS. 2, 3, 4 are more compact than the HV capacitor 1 according to the embodiment of a known type represented in FIG. 1.

Moreover, the integration of an electromagnetic shield layer 51 in the substrate 22 enables reduction of the sensitivity of the HV capacitor 21 to electromagnetic disturbances coming from other components of the circuit in which it is integrated or coming from outside.

Finally, it is clear that modifications and variations may be made to the disclosure described and illustrated herein, without thereby departing from the sphere of protection of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming, on a substrate, a first electrode including a first conductive layer;
    forming, on the substrate, a contact region by exposing a portion of the first conductive layer;
    forming a dielectric body on the first electrode;
    selectively removing portions of the dielectric body so that the dielectric body extends continuously in a first dielectric region and discontinuously in a second dielectric region;
    forming a first dielectric layer on the first electrode, the first dielectric layer including the first dielectric region and the second dielectric region, the second dielectric region being contiguous to the first dielectric region and extends between the first dielectric region and the contact region;
    forming a second electrode including a second conductive layer on the first dielectric layer in the first dielectric region, a surface of the second dielectric region defining a surface path between the second conductive layer and the contact region; and forming a plurality of grooves in the second dielectric region, the plurality of grooves increase a spatial extension of said surface path,
wherein forming the first dielectric layer includes conformably depositing or spinning a polymeric material on the dielectric body, and simultaneously forming the plurality of grooves.

2. The method of claim 1, wherein said surface path between the second conductive layer and the contact region includes a plurality of resistive electrical paths between the second conductive layer and the contact region,
wherein forming the plurality of grooves includes forming the plurality of grooves having a main surface direction of extension that forms an angle with a shortest resistive electrical path of said plurality of resistive paths.

3. The method of claim 1, wherein selectively removing portions of the dielectric body includes forming a plurality of trenches through the dielectric body by performing a masked etch of the dielectric body.

4. The method of claim 1, wherein forming the dielectric body includes:
forming a second dielectric layer of tetraethyl orthosilicate or silicon oxide on the first electrode, and
forming a third dielectric layer of silicon nitride or silicon oxynitride on the second dielectric layer.

5. The method of claim 1, wherein forming the first dielectric layer includes depositing or spinning polyimide.

6. The method of claim 1, further comprising:
forming a protective layer of an oxidation-resistant conductive material on and in contact with the first conductive layer.

7. The method of claim 1, further comprising:
forming a barrier layer of conductive material between the second conductive layer and the first dielectric layer, said barrier layer including a material that inhibits migration of conductive species from the second conductive layer to the first dielectric layer.

8. The method of claim 1, further comprising:
forming an electromagnetic shield layer of conductive material between the substrate and the first electrode; and
forming an electrical-decoupling layer of insulating material between the electromagnetic shield layer and the first electrode.

9. A method, comprising:
forming a first electrode on a substrate, a portion of the first electrode being exposed in a contact region;
forming a dielectric body on the first electrode;
selectively removing portions of the dielectric body so that the dielectric body extends continuously in a first dielectric region and discontinuously in a second dielectric region;
forming a second electrode on the first electrode; and
forming a first dielectric layer on the first electrode, the first dielectric layer including the first dielectric region extending in a first direction between the first electrode and the second electrode, and the second dielectric region extending in a second direction between the first dielectric region and the contact region, the second direction being transverse to the first direction, the second dielectric region being contiguous to the first dielectric region,
wherein the second dielectric region has an undulating surface that defines a surface path between the first electrode and the contact region, the undulating surface including a plurality of grooves overlying the first electrode, and
wherein forming the first dielectric layer includes conformably depositing or spinning a polymeric material on the dielectric body, and simultaneously forming the plurality of grooves.

10. The method of claim 9, wherein the surface path includes a plurality of surface resistive electrical paths between the second electrode and the contact region, and wherein a shortest resistive electrical path of the plurality of resistive electrical paths is within a range from 60 µm to 1060 µm.

11. The method of claim 9, wherein the surface path between the second electrode and the contact region includes a plurality of resistive electrical paths between the second electrode and the contact region, and the plurality of grooves having a respective main direction of surface extension that forms an angle with a shortest resistive electrical path of the plurality of resistive electrical paths.

12. The method of claim 9, wherein selectively removing portions of the dielectric body includes forming a plurality of trenches through the dielectric body by performing a masked etch of the dielectric body.

13. The method of claim 9, wherein forming the dielectric body includes:
forming a second dielectric layer of tetraethyl orthosilicate or silicon oxide on the first electrode, and
forming a third dielectric layer of silicon nitride or silicon oxynitride on the second dielectric layer.

14. The method of claim 9, wherein the substrate includes a layer of insulating material having a thickness between 0.5 µm and 2 µm.

15. The method of claim 9, wherein the substrate includes a high-resistivity material layer and a field plate oxide layer on the high-resistivity material layer, wherein the high-resistivity material layer has an electrical resistivity greater than 1000 Ω·cm.

16. A method, comprising:
forming a capacitor, the forming the capacitor including:
forming, on a substrate, a first electrode including a first conductive layer;
forming, on the substrate, a contact region by exposing a portion of the first conductive layer;
forming a dielectric body on the first electrode;
selectively removing portions of the dielectric body so that the dielectric body extends continuously in a first dielectric region and discontinuously in a second dielectric region;
forming a first dielectric layer on the first electrode, the first dielectric layer including the first dielectric region and the second dielectric region, the second dielectric region being contiguous to the first dielectric region and extends between the first dielectric region and the contact region;
forming a second electrode including a second conductive layer on the first dielectric layer in the first dielectric region, a surface of the second dielectric region defining a surface path between the second conductive layer and the contact region; and
forming a plurality of grooves in the second dielectric region, the plurality of grooves increase a spatial extension of said surface path;
wherein forming the first dielectric layer includes conformably depositing or spinning a polymeric material on the dielectric body, and simultaneously forming the plurality of grooves; and
electrically coupling the capacitor between a first electronic circuit and a second electronic circuit, the capacitor being configured to galvanically isolate the first and second electronic circuits and transfer an output signal of the first electronic circuit.

17. The method of claim 16, wherein the first electronic circuit and the second electronic circuit are integrated on respective dies and housed in a same package.

18. The method of claim 17, wherein the capacitor is integrated on the same die as the second electronic circuit.

* * * * *